United States Patent
Xu

(10) Patent No.: US 9,741,958 B2
(45) Date of Patent: Aug. 22, 2017

(54) ORGANIC LIGHT EMITTING DIODE DISPLAY PANEL AND DISPLAY DEVICE

(71) Applicant: Shenzhen China Star Optoelectronics Technology Co., Ltd., Shenzhen (CN)

(72) Inventor: Chao Xu, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/908,138

(22) PCT Filed: Jan. 6, 2016

(86) PCT No.: PCT/CN2016/070293
§ 371 (c)(1),
(2) Date: Jan. 28, 2016

(65) Prior Publication Data
US 2017/0170421 A1 Jun. 15, 2017

(30) Foreign Application Priority Data

Dec. 10, 2015 (CN) .......................... 2015 1 0918428

(51) Int. Cl.
| H01L 51/00 | (2006.01) |
| H01L 51/52 | (2006.01) |
| H01L 51/50 | (2006.01) |

(52) U.S. Cl.
CPC .......... *H01L 51/52* (2013.01); *H01L 51/5056* (2013.01); *H01L 51/5072* (2013.01); *H01L 51/5088* (2013.01); *H01L 51/5092* (2013.01); *H01L 51/5206* (2013.01)

(58) Field of Classification Search
CPC . H01L 51/52; H01L 51/5056; H01L 51/5072; H01L 51/5088; H01L 51/5092; H01L 51/5206
See application file for complete search history.

(56) References Cited

U.S. PATENT DOCUMENTS

| 2002/0076846 A1* | 6/2002 | Ihm | B82Y 10/00 438/34 |
| 2006/0017055 A1* | 1/2006 | Cropper | H01L 51/56 257/77 |
| 2008/0238310 A1* | 10/2008 | Forrest | H01L 51/5275 313/506 |
| 2009/0015150 A1* | 1/2009 | Kang | H01L 51/50 313/504 |
| 2011/0057176 A1* | 3/2011 | Kang | H01L 51/5052 257/40 |
| 2011/0193477 A1* | 8/2011 | Lifka | H01L 51/0015 313/504 |

(Continued)

*Primary Examiner* — Nicholas Tobergte

(57) ABSTRACT

An organic light emitting diode display panel is provided. The organic light emitting diode display panel comprises a glass substrate, a conductive layer, an anode, a hole inject layer, a hole transport layer, an organic light-emitting layer, an electron inject layer and a cathode. The present invention further provides an organic light emitting diode display device. The organic light emitting diode display panel and the organic light emitting diode display device can effectively reduce a horizontal resistance of the organic light emitting diode display panel through setting the conductive layer, thereby improving the luminous uniformity of the organic light emitting diode display panel.

17 Claims, 2 Drawing Sheets

(56) References Cited

U.S. PATENT DOCUMENTS

| | | | | |
|---|---|---|---|---|
| 2012/0103660 A1* | 5/2012 | Gupta | ............... | H01L 51/0021 |
| | | | | 174/126.2 |
| 2012/0299462 A1* | 11/2012 | Shi | ................ | H01L 51/5209 |
| | | | | 313/498 |
| 2014/0061625 A1* | 3/2014 | Zhang | ............... | H01L 51/0036 |
| | | | | 257/40 |
| 2016/0005988 A1* | 1/2016 | Lee | ............... | C08L 101/12 |
| | | | | 136/256 |

* cited by examiner

ORGANIC LIGHT EMITTING DIODE DISPLAY PANEL AND DISPLAY DEVICE

RELATED APPLICATIONS

This application is a National Phase of PCT Patent Application No. PCT/CN2016/070293 having International filing date of Jan. 6, 2016, which claims the benefit of priority of Chinese Patent Application No. 201510918428.9 filed on Dec. 10, 2015. The contents of the above applications are all incorporated by reference as if fully set forth herein in their entirety.

FIELD AND BACKGROUND OF THE INVENTION

The present invention relates to display technology, and more particularly to an organic light emitting diode display panel and display device.

During the operation of a large-size organic light emitting diode (OLED) display panel, a phenomenon of light emitting unevenly often occurs. The main reason is the uneven distribution of vertical resistance and the excessively large amount of horizontal resistance. Besides, the vertical resistance is mainly determined by an energy level structure, carrier mobility, and a thickness of each layer of the device, and the horizontal resistance is mainly determined by a conductivity of a transparent electrode. Due to a limitation of high horizontal resistance of the transparent electrode, when a current is applied to an edge of the OLED display panel, it is difficult for the current to reach a central region of the OLED display panel. Therefore, uneven light emitting of the OLED display panel is caused.

Thus, it is necessary to provide an organic light emitting diode display panel and display device to solve the problems of the prior art.

SUMMARY OF THE INVENTION

For the reasons mentioned above, the present invention provides an organic light emitting diode display panel and display device to solve the problems of uneven light emission of the OLED display panel in the conventional technology.

The present invention provides an organic light emitting diode display panel, comprising:
a glass substrate;
an anode disposed on the glass substrate utilized for generating a hole when a driving voltage is applied;
a hole inject layer disposed on the anode for injecting the hole into an organic light-emitting layer;
a hole transport layer disposed on the hole inject layer for transporting the hole injected by the hole inject layer to the organic light-emitting layer;
the organic light-emitting layer disposed on the hole transport layer for recombining the hole with an electron transported by an electron transport layer to emit light;
the electron transport layer disposed on the organic light-emitting layer for transporting an electron injected by a cathode to the organic light-emitting layer; and
the cathode utilized for generating the electron when the driving voltage is applied;
wherein a conductive layer is disposed between the anode and the glass substrate;
wherein the conductive layer is a metal grids layer, a conductivity of the metal grids layer is greater than a conductivity of the anode, the conductive layer is disposed on the glass substrate through a manner of using a metallic ink for performing a screen printing.

In the organic light emitting diode display panel described above, a grid structure of the metal grids layer is square, hexagonal, or rectangular.

In the organic light emitting diode display panel described above, a material of the metallic ink is a conductive silver paste or a carbon nanotube solution.

In the organic light emitting diode display panel described above, a material of the anode is Indium Tin Oxide or Aluminum Zinc Oxide.

In the organic light emitting diode display panel described above, an electron inject layer configured for injecting the electron into the organic light-emitting layer is disposed between the electron transport layer and the cathode.

The present invention further provides an organic light emitting diode display panel, comprising:
a glass substrate;
an anode disposed on the glass substrate utilized for generating a hole when a driving voltage is applied;
a hole inject layer disposed on the anode for injecting the hole into an organic light-emitting layer;
a hole transport layer disposed on the hole inject layer for transporting the hole injected by the hole inject layer to the organic light-emitting layer;
the organic light-emitting layer disposed on the hole transport layer for recombining the hole with an electron transported by an electron transport layer to emit light;
the electron transport layer disposed on the organic light-emitting layer for transporting an electron injected by a cathode to the organic light-emitting layer; and
the cathode utilized for generating the electron when the driving voltage is applied;
wherein a conductive layer is disposed between the anode and the glass substrate.

In the organic light emitting diode display panel described above, the conductive layer is a metal grids layer, a conductivity of the metal grids layer is greater than a conductivity of the anode.

In the organic light emitting diode display panel described above, a grid structure of the metal grids layer is square, hexagonal, or rectangular.

In the organic light emitting diode display panel described above, the conductive layer is disposed on the glass substrate through a manner of using a metallic ink for performing a screen printing.

In the organic light emitting diode display panel described above, a material of the metallic ink is a conductive silver paste or a carbon nanotube solution.

In the organic light emitting diode display panel described above, a material of the anode is Indium Tin Oxide or Aluminum Zinc Oxide.

In the organic light emitting diode display panel described above, an electron inject layer configured for injecting the electron into the organic light-emitting layer is disposed between the electron transport layer and the cathode.

The present invention further provides an organic light emitting diode display device, comprising an organic light emitting diode display panel, which comprises:
a glass substrate;
an anode disposed on the glass substrate utilized for generating a hole when a driving voltage is applied;
a hole inject layer disposed on the anode for injecting the hole into an organic light-emitting layer;
a hole transport layer disposed on the hole inject layer for transporting the hole injected by the hole inject layer to the organic light-emitting layer;

the organic light-emitting layer disposed on the hole transport layer for recombining the hole with an electron transported by an electron transport layer to emit light;

the electron transport layer disposed on the organic light-emitting layer for transporting an electron injected by a cathode to the organic light-emitting layer; and the cathode utilized for generating the electron when the driving voltage is applied;

wherein a conductive layer is disposed between the anode and the glass substrate.

In the organic light emitting diode display device described above, the conductive layer is a metal grids layer, a conductivity of the metal grids layer is greater than a conductivity of the anode.

In the organic light emitting diode display device described above, a grid structure of the metal grids layer is square, hexagonal, or rectangular.

In the organic light emitting diode display device described above, the conductive layer is disposed on the glass substrate through a manner of using a metallic ink for performing a screen printing.

In the organic light emitting diode display device described above, a material of the metallic ink is a conductive silver paste or a carbon nanotube solution.

In the organic light emitting diode display device described above, a material of the anode is Indium Tin Oxide or Aluminum Zinc Oxide.

In the organic light emitting diode display device described above, an electron inject layer configured for injecting the electron into the organic light-emitting layer is disposed between the electron transport layer and the cathode.

The organic light emitting diode display panel and display device of the present invention can effectively reduce a horizontal resistance of the organic light emitting diode display panel through setting the conductive layer, thereby improving the luminous uniformity of the organic light emitting diode display panel and solving the problem of uneven light emission of the conventional organic light emitting diode display panel and display device.

BRIEF DESCRIPTION OF THE SEVERAL VIEWS OF THE DRAWINGS

In order to more clearly describe the embodiments of the present invention or the conventional technical solutions, the description is used to make a simple introduction of the drawings used in the following embodiments. The following description of the drawings are merely some embodiments of the present invention, those of ordinary skill in the art can also obtain other drawings based on these drawings without creative effort.

DESCRIPTION OF SPECIFIC EMBODIMENTS OF THE INVENTION

Figure 1:
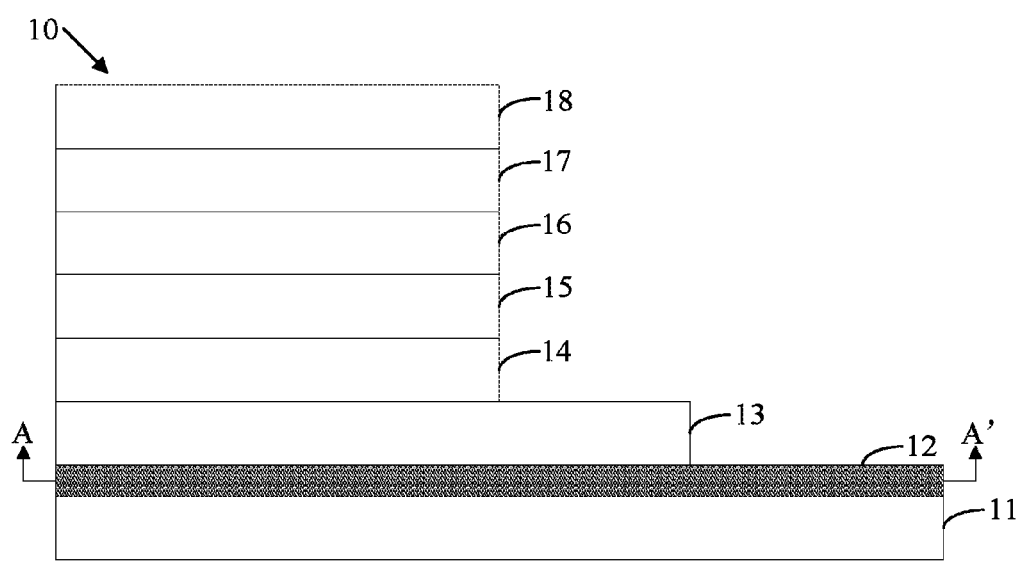
FIG. 1 is a structural schematic view of an organic light emitting diode display panel according to a preferred embodiment of the present invention.

Referring to the drawings of the present invention, the same component is labeled as the same number. The following description is based on the particular illustrated embodiment of the present invention, which should not be construed as limiting the present invention.

Refer to FIG. 1, which is a structural schematic view of an organic light emitting diode display panel according to a preferred embodiment of the present invention. The preferred embodiment of the present invention provides an organic light emitting diode display panel 10, comprising: a glass substrate 11, a conductive layer 12, an anode 13, a hole inject layer (HIL) 14, a hole transport layer (HTL) 15, an organic light-emitting layer (EML) 16, an electron transport layer (ETL) 17, and a cathode 18.

The anode 13 disposed on the glass substrate 11 is utilized for generating holes when a driving voltage is applied. A material of the anode 13 is Indium Tin Oxide or Aluminum Zinc Oxide. The conductive layer 12 is disposed between the anode 13 and the glass substrate 11 for reducing a horizontal resistance of the organic light emitting diode display panel. The hole inject layer 14 is disposed on the anode 13 for injecting the hole into an organic light-emitting layer 16. The hole transport layer 15 is disposed on the hole inject layer 14 for transporting the hole injected by the hole inject layer 15 to the organic light-emitting layer 16. The organic light-emitting layer 16 is disposed on the hole transport layer 15 for recombining the hole with an electron transported by an electron transport layer 17 to emit light. The electron transport layer 17 is disposed on the organic light-emitting layer 16 for transporting an electron injected by a cathode 18 to the organic light-emitting layer 16. The cathode 18 is utilized for generating the electrons when the driving voltage is applied.

Preferably, an electron inject layer (EIL) configured for injecting the electron into the organic light-emitting layer 16 is disposed between the electron transport layer 17 and the cathode 18.

Figure 2:
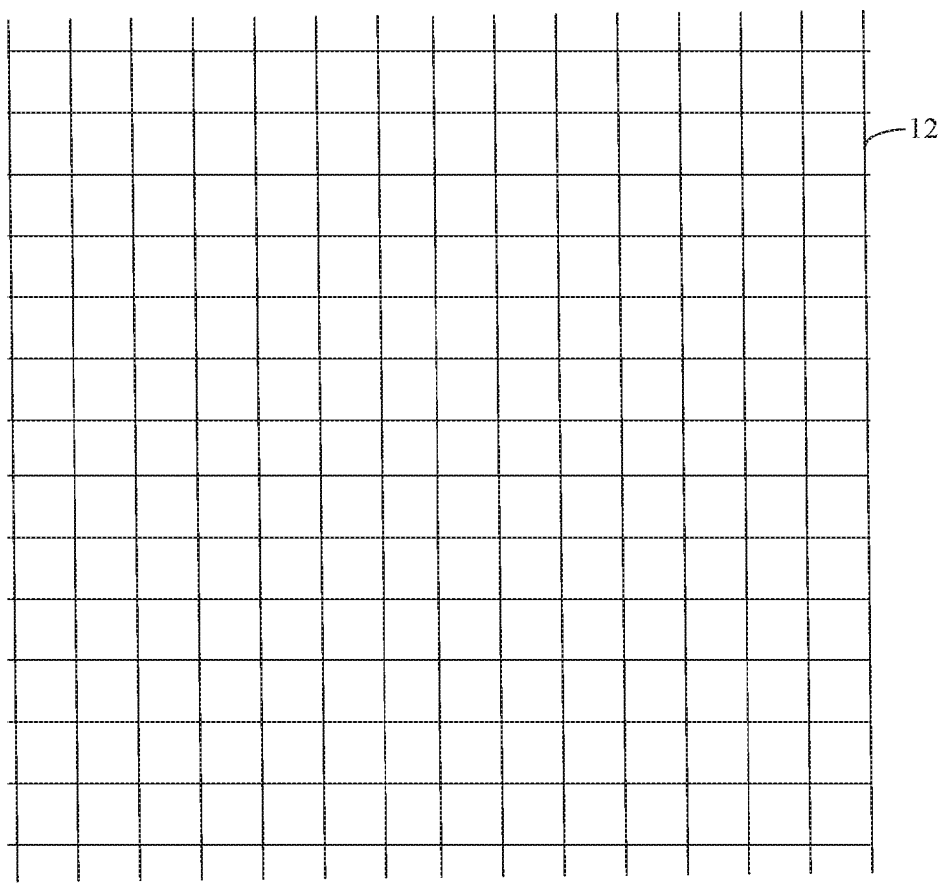
FIG. 2 is a sectional view of line A-A' in FIG. 1.

Referring to FIG. 2, the conductive layer 12 is a metal grids layer. A conductivity of the metal grids layer is greater than a conductivity of the anode 13. A grid structure of the metal grids layer is square, hexagonal, or rectangular.

When manufacturing the organic light emitting diode display panel 10 of the preferred embodiment of the present invention, firstly, a metallic ink is coated on the glass substrate 11 through a screen printing. Then, a drying process is performed on the metallic ink for obtaining the conductive layer 12 with high conductivity.

Then, an anode material, such as Indium Tin Oxide or Aluminum Zinc Oxide, is deposited on the conductive layer 12 by a chemical vapor deposition process or an evaporation process until a surface of the anode 13 is flat, thereby ensuring that the anode 13 completely contacts the hole inject layer 14.

Finally, the hole inject layer 14, the hole transport layer 15, the organic light-emitting layer 16, the electron transport layer 17, and the cathode 18 are sequentially formed on the anode 13.

This completes the production of the OLED display panel 10 of the preferred embodiment.

When the organic light emitting diode display panel is in practical application, such as a current is horizontal transferred on the anode 13, the resistance of the conductive layer 12 and the resistance of the anode 13 are connected in parallel for lowering a horizontal resistance of the anode 13 in a horizontal direction, thereby improving the light-emitting uniformity of the large-area organic light emitting diode display panel while a manufacturing method of the conductive layer is simple and the production cost is low.

The present further provides an organic light emitting diode display device, comprising an organic light emitting diode display panel. The organic light emitting diode display panel comprises a glass substrate, a conductive layer, an anode, a hole inject layer, a hole transport layer, an organic light-emitting layer, an electron inject layer, and a cathode.

The anode is disposed on the glass substrate 11 for generating a hole when a driving voltage is applied. The conductive layer is disposed between the anode and the glass substrate for reducing a horizontal resistance of the organic light emitting diode display panel. The hole inject layer is disposed on the anode for injecting the hole into an organic light-emitting layer. The hole transport layer is disposed on the hole inject layer for transporting the hole injected by the hole inject layer to the organic light-emitting layer. The organic light-emitting layer 16 is disposed on the hole transport layer for recombining the hole with an electron transported by an electron transport layer to emit light. The electron transport layer is disposed on the organic light-emitting layer for transporting an electron injected by a cathode to the organic light-emitting layer. The cathode is utilized for generating the electron when the driving voltage is applied.

Preferably, the conductive layer is a metal grids layer, a conductivity of the metal grids layer is greater than a conductivity of the anode.

Preferably, a grid structure of the metal grids layer is square, hexagonal or rectangular.

Preferably, the conductive layer is disposed on the glass substrate through a manner of using a metallic ink for performing a screen printing.

Preferably, a material of the metallic ink is a conductive silver paste or a carbon nanotube solution.

Preferably, a material of the anode is Indium Tin Oxide or Aluminum Zinc Oxide.

Preferably, an electron inject layer configured for injecting the electron into the organic light-emitting layer is disposed between the electron transport layer and the cathode.

The specific principle of operation of the organic light emitting diode display device in this preferred embodiment is identical or similar to the organic light emitting diode display panel in the above mentioned preferred embodiment. The related description can be referred in the description of the organic light emitting diode display panel in the above mentioned preferred embodiment.

The organic light emitting diode display panel and display device of the present invention can effectively reduce a horizontal resistance of the organic light emitting diode display panel through setting the conductive layer, thereby improving the luminous uniformity of the organic light emitting diode display panel and solving the problem of uneven light emission of the conventional organic light emitting diode display panel and display device.

The present invention has been described with preferred embodiments thereof, and it is understood that many changes and modifications to the described embodiment can be carried out without departing from the scope and the spirit of the invention that is intended to be limited only by the appended claims.

What is claimed is:

1. An organic light emitting diode display panel, comprising:
    a glass substrate;
    an anode, disposed on the glass substrate utilized, for generating a hole when a driving voltage is applied;
    a hole inject layer, disposed on the anode, for injecting the hole into an organic light-emitting layer;
    a hole transport layer, disposed on the hole inject layer, for transporting the hole injected by the hole inject layer to the organic light-emitting layer;
    the organic light-emitting layer, disposed on the hole transport layer, for recombining the hole with an electron transported by an electron transport layer to emit light;
    the electron transport layer, disposed on the organic light-emitting layer, for transporting an electron injected by a cathode to the organic light-emitting layer; and
    the cathode utilized for generating the electron when the driving voltage is applied;
    wherein a conductive layer is disposed between the anode and the glass substrate;
    wherein the conductive layer is a metal grids layer, a conductivity of the metal grids layer is greater than a conductivity of the anode, the conductive layer is disposed on the glass substrate through a manner of using a metallic ink for performing a screen printing.

2. The organic light emitting diode display panel according to claim 1, wherein a grid structure of the metal grids layer is square, hexagonal, or rectangular.

3. The organic light emitting diode display panel according to claim 1, wherein a material of the metallic ink is a conductive silver paste or a carbon nanotube solution.

4. The organic light emitting diode display panel according to claim 1, wherein a material of the anode is Iridium Tin Oxide or Aluminum Zinc Oxide.

5. The organic light emitting diode display panel according to claim 1, wherein an electron inject layer configured for injecting the electron into the organic light-emitting layer is disposed between the electron transport layer and the cathode.

6. An organic light emitting diode display panel, comprising:
    a glass substrate;
    an anode disposed on the glass substrate utilized for generating a hole when a driving voltage is applied;
    a hole inject layer disposed on the anode for injecting the hole into an organic light-emitting layer;
    a hole transport layer disposed on the hole inject layer for transporting the hole injected by the hole inject layer to the organic light-emitting layer;
    the organic light-emitting layer disposed on the hole transport layer for recombining the hole with an electron transported by an electron transport layer to emit light;
    the electron transport layer disposed on the organic light-emitting layer for transporting an electron injected by a cathode to the organic light-emitting layer; and
    the cathode utilized for generating the electron when the driving voltage is applied;
    wherein a conductive layer is disposed between the anode and the glass substrate;
    wherein the conductive layer is a metal grids layer, a conductivity of the metal grids layer is greater than a conductivity of the anode.

7. The organic light emitting diode display panel according to claim 6, wherein a grid structure of the metal grids layer is shaped as a square, hexagonal, or rectangular.

8. The organic light emitting diode display panel according to claim 6, wherein the conductive layer is disposed on the glass substrate with a metallic ink by using screen printing.

9. The organic light emitting diode display panel according to claim 8, wherein a material of the metallic ink is a conductive silver paste or a carbon nanotube solution.

10. The organic light emitting diode display panel according to claim 8, wherein a material of the anode is Iridium Tin Oxide or Aluminum Zinc Oxide.

11. The organic light emitting diode display panel according to claim 6, wherein an electron inject layer configured for injecting the electron into the organic light-emitting layer is disposed between the electron transport layer and the cathode.

12. An organic light emitting diode display device, comprising an organic light emitting diode display panel, which comprises:
   a glass substrate;
   an anode disposed on the glass substrate utilized for generating a hole when a driving voltage is applied;
   a hole inject layer disposed on the anode for injecting the hole into an organic light-emitting layer;
   a hole transport layer disposed on the hole inject layer for transporting the hole injected by the hole inject layer to the organic light-emitting layer;
   the organic light-emitting layer disposed on the hole transport layer for recombining the hole with an electron transported by an electron transport layer to emit light;
   the electron transport layer disposed on the organic light-emitting layer for transporting an electron injected by a cathode to the organic light-emitting layer; and
   the cathode utilized for generating the electron when the driving voltage is applied;
   wherein a conductive layer is disposed between the anode and the glass substrate;
   wherein the conductive layer is a metal grids layer, a conductivity of the metal grids layer is greater than a conductivity of the anode.

13. The organic light emitting diode display device according to claim 12, wherein a grid structure of the metal grids layer is square, hexagonal, or rectangular.

14. The organic light emitting diode display device according to claim 12, wherein the conductive layer is disposed on the glass substrate through a manner of using a metallic ink for performing a screen printing.

15. The organic light emitting diode display device according to claim 14, wherein a material of the metallic ink is a conductive silver paste or a carbon nanotube solution.

16. The organic light emitting diode display device according to claim 14, wherein a material of the anode is Indium Tin Oxide or Aluminum Zinc Oxide.

17. The organic light emitting diode display device according to claim 12, wherein an electron inject layer configured for injecting the electron into the organic light-emitting layer is disposed between the electron transport layer and the cathode.

* * * * *